(12) United States Patent  
Bruset et al.

(10) Patent No.: US 9,035,705 B2
(45) Date of Patent: May 19, 2015

(54) LOW-POWER OSCILLATOR

(75) Inventors: Ola Bruset, Sjetnemarka (NO); Tor Oyvind Vedal, Gimse (NO)

(73) Assignee: NORDIC SEMICONDUCTOR ASA, Trondheim (NO)

( * ) Notice: Subject to any disclaimer, the term of this patent is extended or adjusted under 35 U.S.C. 154(b) by 120 days.

(21) Appl. No.: 13/980,122

(22) PCT Filed: Jan. 19, 2012

(86) PCT No.: PCT/GB2012/050110
§ 371 (c)(1), (2), (4) Date: Sep. 18, 2013

(87) PCT Pub. No.: WO2012/098399
PCT Pub. Date: Jul. 26, 2012

(65) Prior Publication Data
US 2014/0049327 A1  Feb. 20, 2014

(30) Foreign Application Priority Data
Jan. 20, 2011  (GB) .................................. 1100986.7

(51) Int. Cl.
*H03L 7/24* (2006.01)
*G06F 1/08* (2006.01)
*H03K 5/135* (2006.01)

(52) U.S. Cl.
CPC .. *H03L 7/24* (2013.01); *G06F 1/08* (2013.01); *H03K 5/135* (2013.01)

(58) Field of Classification Search
USPC ........................................... 331/44, 47
See application file for complete search history.

(56) References Cited

U.S. PATENT DOCUMENTS

| 4,318,008 | A | * | 3/1982 | Nall ............................ 307/84 |
| 5,525,936 | A | * | 6/1996 | Post et al. ..................... 331/47 |
| 7,250,825 | B2 | * | 7/2007 | Wilson et al. .................. 331/44 |
| 7,792,652 | B1 | | 9/2010 | Chui | |
| 2003/0095008 | A1 | | 5/2003 | Kranz | |
| 2010/0277246 | A1 | * | 11/2010 | Seth et al. ..................... 331/34 |

FOREIGN PATENT DOCUMENTS

| GB | 2450313 A | 12/2008 |
| GB | 2454364 A | 5/2009 |
| WO | WO 00/08790 A1 | 2/2000 |
| WO | WO 2006/138499 A1 | 12/2006 |
| WO | WO 2010/093461 A1 | 8/2010 |

OTHER PUBLICATIONS

Notification of Transmittal of International Search Report and Written Opinion for PCT/GB2012/050110 dated Sep. 6, 2012.

(Continued)

*Primary Examiner* — Joseph Chang
(74) *Attorney, Agent, or Firm* — Koppel, Patrick, Heybl & Philpott

(57) ABSTRACT

An integrated oscillator circuit comprises an oscillator configured to be switched between a first frequency and a second frequency. A switching circuit receives an input representing a target frequency and switches the oscillator between the first and second frequencies at intervals determined by the input, so as to cause the average output frequency of the oscillator to approximate the target frequency.

33 Claims, 6 Drawing Sheets

(56) References Cited

OTHER PUBLICATIONS

U.S. Publication No. 2010/277246 A1 (Seth Manu, et al.), published Nov. 4, 2010.
U.S. Publication No. 2006/223454 A1 (Westwick, et al.), published Oct. 5, 2006.
Final UK examination report for GB1200906.4 dated Mar. 8, 2014.
UK Grant of notification for GB2488013 dated Aug. 6, 2013.
UK Patent GB2488013 issued Sep. 4, 2013 (Application No. 1200906.4 based on GB 1100986).

* cited by examiner

LOW-POWER OSCILLATOR

This invention relates to an accurate electronic oscillator.

Many electronic circuits require a clock source. This is commonly a high-frequency crystal oscillator in circuits which contain a microprocessor. However, such a high-frequency crystal oscillator draws significant current. For power-sensitive applications, it can therefore be desirable additionally or alternatively to use a relatively lower-power, lower-frequency clock source for some timing functions.

Such an arrangement is particularly desirable in battery-powered devices, where battery life can be conserved by keeping a main microprocessor and its high-frequency crystal powered-down for as much of the time as possible. A low-frequency oscillator and associated timer can be used in such contexts to generate a wakeup signal for the microcontroller and high-frequency crystal at a precise time with minimal power consumption (e.g. to meet a low-average-power transmission protocol, as will be explained below).

Commonly, a low-frequency clock signal is generated using a low-frequency crystal oscillator (e.g. a 32.768 kHz crystal) or a relaxation oscillator circuit (e.g. a resistor-capacitor (RC) oscillator).

A 32.768 kHz crystal oscillator can provide high accuracy (e.g. +/−30 parts per million (ppm)) with a relatively-low current consumption (e.g. 0.5 microamps). However, it requires an external crystal, which is a large, discrete component, and thus takes up considerable space on a printed circuit board (PCB). This can be a significant disadvantage in space-constrained devices such as mobile telephones. It also requires an additional two chip pins in order to connect to the integrated circuit. Moreover, an external crystal can add significantly to the total bill of materials for the circuit.

By contrast, a fully-integrated relaxation oscillator circuit occupies no chip pins and avoids the need for external components. It is also considerably cheaper than a crystal and can have similarly-low current consumption to the crystal oscillator. However, it is far less accurate than a crystal, having a typical accuracy of +/−300,000 ppm. With careful calibration (e.g. by appropriately adjusting a programmable resistor), this accuracy can be improved to around +/−10,000 ppm, but this is still a factor of 300 to 1000 times worse than the crystal oscillator.

Accurate timing is often critical to achieving good power efficiency in an application. This is especially true in a low-power radio system using packet-based transmission and time division multiplexing (TDM). In this situation, much of the circuitry on a slave device can be asleep for much of the time, with a low-frequency timer being used to wake up the necessary parts at the correct time to receive and process an incoming packet from a master transmitter. If 500-micosecond packets are transmitted every 1 second, then receiving and acknowledging a packet may take only around 1 millisecond. With an accurate clock, it should therefore be possible for the system to be largely powered down for up to 99.9% of the time.

However, if the low-frequency clock driving the timer is inaccurate, it will be necessary to open the radio receive window conservatively early, to minimise the chance of missing a transmitted packet due to the clock running slowly. An inaccurate clock therefore results in power being wasted because the receiver circuitry and microprocessor must be woken earlier than may be necessary. Even if the oscillator has an accuracy of +/−10,000 ppm, as a well-calibrated relaxation oscillator might, then the microcontroller must still be woken up 1% before the end of the idle period; i.e. 10 milliseconds early for a 1 second idle period. The receiver would then be awake for 11 milliseconds rather than the ideal 1 millisecond, leading to a substantial reduction in battery life for the slave device.

The present invention seeks to provide an oscillator circuit that addresses shortcomings of conventional low-frequency oscillators.

From one aspect, the invention provides an integrated oscillator circuit comprising:
- an oscillator configured to be switched between a first frequency and a second frequency; and
- switching means configured to receive an input representative of a target frequency and to switch the oscillator between the first and second frequencies at intervals determined by the input so as to cause the average output frequency of the oscillator to approximate the target frequency.

This aspect of the invention extends to a method of operating an integrated-circuit oscillator, wherein the oscillator is configured to be switched between a first frequency and a second frequency, the method comprising receiving an input representative of a target frequency and switching the oscillator between the first and second frequencies at intervals determined by the target frequency so as to cause the average output frequency of the oscillator to approximate the target frequency.

It also extends to an integrated circuit comprising such an oscillator and further comprising a microprocessor or microcontroller (e.g. a system-on-chip).

Thus it will be seen by those skilled in the art that, in accordance with the invention, by suitably configuring the pattern of switching between the two output frequencies, the oscillator can synthesise an output frequency which is exactly or approximately equal to a target frequency (when averaged over a number of cycles). The oscillator can be calibrated to produce a desired, effective output frequency with far greater precision than is possible with known RC oscillators that simply employ a fixed capacitor in combination with a fixed or programmable resistor.

The Applicant believes that accuracies of +/−100 ppm are achievable in embodiments of the present invention, which is some 100 times better than a conventional, calibrated RC oscillator. This accuracy approaches that of a crystal oscillator, without the cost and space requirements of a crystal, while still sharing the low-power characteristics of a low-frequency crystal.

Preferably the two frequencies are similar, which enables the output frequency to be controlled accurately and smoothly. Thus the higher of the first and second frequencies is preferably less than double the lower of the two frequencies; more preferably it is less than 10% higher; and most preferably it is around 3% higher. For example, the ratio between the two frequencies may be 33:32 or thereabouts. The ratio is ideally set such the difference (which may be absolute or relative) between the two frequencies is wider than a smallest increment by which one or other of the frequencies can be adjusted (e.g. by controlling a current source for the oscillator). In this way, any error that remains after a coarse calibration of one or both of the oscillator frequencies can be corrected for by appropriate switching between the two frequencies.

Under normal operation the target frequency should have a value somewhere between the first and second frequencies.

Because the output of the oscillator can be controlled very accurately, it is possible to switch seamlessly between using the output from the oscillator circuit and using the output of some other clock source, such as a crystal oscillator or a low-frequency clock synthesized from a higher-frequency clock.

The input to the switching means may comprise a digital signal or an analogue signal representative of the target frequency. In some preferred embodiments, the input comprises or encodes a value indicating a switching ratio between the first and second frequencies. This ratio may represent a proportion of oscillator cycles at which the oscillator should operate at the first frequency, relative to the second frequency. For example, the input may comprise a digital value (e.g. a 10-bit number) indicating the number of oscillator cycles out of every 1024 cycles for which the oscillator should operate at the lower of the two frequencies. The switching means may determine how to switch between the two frequencies over a period of time (a switching pattern) so as to meet the indicated ratio.

The input to the switching means is preferably provided by a calibration controller, which may form part of the oscillator or may be separate therefrom. The calibration controller may be configured to perform a (fine) calibration of the oscillator at intervals in order to generate an updated input to be provided to the oscillator.

The oscillator is preferably calibrated against a reference clock. This reference clock may be generated from a crystal oscillator, such as a relatively high-frequency crystal connected to a microprocessor (e.g. a crystal which oscillates one, two or three orders of magnitude faster than the target frequency of the present oscillator circuit). Because the calibration operation may only need to be performed at intervals, it is not necessary for the high-frequency crystal to be powered up continuously, thus resulting in power-savings made possible by the present invention.

The oscillator is preferably fully integrated on a semiconductor substrate. This makes it very compact and able to be incorporated in a circuit without adding to the bill of materials.

The oscillator component of the oscillator circuit may be of any suitable design. It may, for example, be a relaxation-type oscillator, or a ring oscillator. Whatever design is used, however, it should be able to switch rapidly between the two frequencies; e.g. switching from one cycle to the next, with no residual effect from the frequency setting of the preceding cycle.

In one set of embodiments, the oscillator circuit comprises charge-storing means whose capacitance can be varied between a first value and a second value; and a current source connected to the charge-storing means, to form an oscillator configured to oscillate at the first frequency when said capacitance is equal to the first value, and at the second frequency when the capacitance is equal to the second value. The switching means is then configured to switch the charge-storing means between the first and second capacitance values at intervals determined by the input.

Methods of operating an integrated-circuit oscillator where the oscillator comprises charge-storing means whose capacitance can be varied between a first value and a second value, and a current source connected to the charge-storing means to form an oscillator which oscillates at a first frequency when said capacitance is equal to the first value, and at a second frequency when the capacitance is equal to the second value, may comprise switching the charge-storing means between the first and second capacitance values at intervals determined by the target frequency so as to cause the average output frequency of the oscillator to approximate the target frequency.

The charge-storing means may comprise one or more capacitors. It may be continuously variable between the first and second capacitance values, but is preferably arranged to be switched discretely between the two values. Of course, the invention may be adapted to use more than two capacitance values, such as three or more values, with the switching means being arranged to switch between the three or more values. However, embodiments that use just two values are currently preferred, since they are simpler to implement and nonetheless provide all the described benefits of accuracy and low power.

The charge-storing means may comprise a first capacitor that is permanently connected into the oscillator circuit, a second capacitor that is selectively connectable into the circuit (e.g. in series with the first capacitor, or in parallel), and a switch (e.g. a transistor) arranged to connect the second capacitor into or out of the circuit so as to alter the overall capacitance of the charge-storing means. The second capacitor is preferably smaller than the first, e.g. less than 50% or 10% of the capacitance of the first capacitor; more preferably around 3% of the capacitance, so that the total capacitances with and without the second capacitor differ by only around 3%.

Alternatively, the charge-storing means may comprise first and second capacitors having first and second capacitances, and a switch arranged to connect one or other of the first and the second capacitor into the oscillator circuit at a time. In this case, the second capacitance differs from the first preferably by less than 50% or 10%, and most preferably by around 3%. For example, the capacitance ratio may be 33:32.

In both arrangements, it will be appreciated the first or second capacitors need not in practice comprise single integrated structures, but may comprise a plurality of capacitors acting together as a single charge store. In some embodiments, different capacitors are used for each half period of the clock cycle.

The current source may comprise resistance means (e.g. one or more resistors), or any other suitable means (e.g. an active current source or transistor current source). It may comprise programmable current gearing of a source.

The switching means may switch between the first and second capacitance values in any appropriate way that results in the average output frequency of the oscillator approximating the target frequency. The average output may be the mean output over a predetermined period of time, such as a predetermined number of cycles.

The output of the oscillator may substantially equal the target frequency value when averaged over a suitable period (e.g. the mean over 1024 cycles), or it may approximate the target frequency, by being within an acceptable margin of error or degree of precision, such as within plus or minus 100 ppm. Due to the effects of temperature variation, etc., the oscillator output will typically not exactly attain the theoretical target value. Moreover, when the frequency switching operation is performed according to a ratio over a finite number of cycles, the target frequency may not be able to be met precisely even under ideal circumstances, due to numerical rounding effects. The input to the switching means may, therefore, be determined to be the value from a range of allowable inputs which gives an output frequency that comes closest to the target frequency over a period of time.

The switching means may be configured to distribute high and low frequency cycles across a finite time period so as to produce a relatively smooth output. For example, it may be configured to distribute the frequency cycles at the first frequency as uniformly as possible among the frequency cycles at the second frequency. It may distribute the first-frequency cycles among the second-frequency cycles according to some predetermined pattern or dispersion characteristic. It may be configured to maximise the number of changes of frequency over a time period. By appropriately configuring the frequency switches, the oscillator output can be made to have minimal deviation from the average output frequency (i.e. minimal accumulated jitter over time).

The switching means may be any suitable switching circuit or component. It may comprise a sigma-delta modulator, arranged to distribute the frequency cycles at the first frequency as uniformly as possible among the frequency cycles at the second frequency, over a finite time period.

In order to work effectively, the values of the first and second frequencies should span the value of the target output frequency. To support a range of target outputs, in some embodiments, one or both of the first and second capacitance values can be varied. The oscillator is preferably arranged so that the value of one, or preferably both, of the first and second frequencies depends on the level of a variable current within the oscillator circuit. The oscillator may comprise a programmable current source, e.g. comprising a programmable resistor, or programmable current gearing of a source, which can be used to adjust the current level and thereby alter the first or second frequencies, or both. Such adjustment may be relatively coarse, compared with the relatively fine adjustment of the output frequency which is possible by controlling the switching means.

In some embodiments, a coarse calibration can be performed, in which the values of the first or second frequencies, or both, are adjusted so that they span a target frequency (with one being higher and the other being lower than the target frequency). In one set of embodiments, the oscillator is coarsely calibrated by adjusting the higher of the two frequencies, with the lower frequency being determined as a fixed ratio of the higher frequency, or as a constant offset from the higher frequency.

The coarse calibration may be made against a crystal oscillator, such as a system clock. The calibration may be performed by adjusting a current source, e.g. by adjusting one or more programmable resistors. A current source may be configured to be programmable in percentage steps of the nominal frequency of the oscillator, e.g. 2.5% steps. (The nominal frequency can be the higher or lower of the two frequencies, or an intermediate frequency, such as the mean of the two). The precision of the coarse calibration (e.g. 2.5%) is preferably finer than the difference between the higher and lower frequencies (e.g. 3%), so that any remaining error after a coarse calibration can always be corrected for by a fine calibration operation (described below). Such coarse calibration might typically result in a frequency accuracy for the higher or lower frequencies of around +/−25,000 ppm, similar to a conventional, calibrated RC oscillator.

Additionally or alternatively, a fine calibration operation may be performed to generate an input to the switching means that causes the output frequency of the oscillator to approximate the target frequency. This may result in a final accuracy for the oscillator of around +/−100 ppm. The calibration controller may count oscillator output cycles over a reference time period (measured against a reference clock) for each of the first and second frequencies, and may derive the input to the switching means from these counts, e.g. by calculating the proportion of cycles the oscillator should perform at the lower frequency for a given target output frequency.

The calibration controller may determine when to perform the coarse and/or fine calibrations. A target output frequency may be provided to the controller. The controller may be configured to perform a coarse calibration if it determines that the first and second frequencies no longer span the target frequency (e.g. when performing a fine calibration operation).

A coarse calibration and/or fine calibration may be performed when the chip is first powered up or reset.

A fine calibration may be performed according to a schedule, such as periodically, to allow for temperature fluctuations, or other factors which might potentially affect the circuit. For example, for a target frequency of 32.768 kHz, a fine calibration may be carried out every 0.25 seconds, or every 31.75 seconds (=1111111 binary*0.25 seconds), or at any other suitable interval.

The interval between fine calibrations may be fixed or variable. In some embodiments it may be varied according to data relating to the historical accuracy of the oscillator. For example, if the oscillator is determined to be relatively accurate (for example, because the circuit is not subject to large temperature variations), the interval between calibrations may be increased. This may lengthen the time for which a reference clock source can be asleep, thereby saving power.

The oscillator may be calibrated (fine and/or coarse calibration) when a microcontroller wakes up, or shortly before it wakes up. This may be done every time the microcontroller wakes, or when one or more further conditions are met. Such an approach is power efficient, since the crystal oscillator for the microcontroller will be running anyway when the microcontroller is active, and will not need to be powered up specifically to calibrate the oscillator on these occasions.

This idea is believed to be new and inventive in its own right and thus, from a further aspect, the invention provides an integrated circuit comprising an integrated oscillator, a crystal oscillator, a power-management component and a calibration component, wherein the power-management component is configured to turn the crystal oscillator on when one or more criteria are met, and wherein the calibration controller is configured to calibrate the integrated oscillator against the crystal oscillator, characterised in that the calibration controller is configured to calibrate the integrated oscillator against the crystal oscillator when the crystal oscillator is turned on.

The integrated oscillator may be of any type, including a prior-art relaxation oscillator design (e.g. RC oscillator), but is preferably an oscillator according to the first aspect of the present invention.

The integrated circuit may further comprise a microprocessor or microcontroller which is clocked using the crystal oscillator and which is turned on at or around the same time as the crystal oscillator.

The calibration may be performed simultaneously with the crystal oscillator or microprocessor or microcontroller being turned on, or within a period of time before or after such turning on.

The power-management component may be configured to turn on the crystal oscillator in response to the output of a timer which is clocked using the integrated oscillator.

Calibration operations may, of course, additionally be performed at other times.

The integrated circuit may comprise circuitry forming all or part of a radio transmitter or receiver, and which is configured to transmit or receive radio packets according to a schedule implemented using the integrated oscillator as a clock source.

In any of the foregoing aspects, the oscillator circuit may be configured to output a clock signal, derived from a crystal oscillator, while the oscillator is being calibrated, and to output a clock signal derived from its own oscillations when it is not being calibrated. In this way the oscillator need not pause its output during calibrations. Preferably, the two outputs are of substantially the same frequency (e.g. within the limits of the accuracy of the oscillator). The change from one output type to the other is preferably made within one clock cycle, so that there is a seamless transition in the output signal.

This idea is believed to be new and inventive in its own right and thus, from a further aspect, the invention provides an integrated circuit comprising an integrated oscillator, a crystal oscillator, a timer, and a calibration component arranged to calibrate the integrated oscillator against the crystal oscillator at intervals, wherein the integrated circuit is configured so that the timer receives a clock signal derived from the integrated oscillator except when the integrated oscillator is being calibrated, during which time the timer receives a clock signal derived from the crystal oscillator.

The timer preferably receives clock signals of substantially the same frequency under both conditions. Typically the crystal oscillator will oscillate at a substantially higher frequency than the integrated oscillator (e.g. orders of magnitude higher); therefore, the integrated circuit may comprise one of more frequency multipliers or dividers connected between the timer and the crystal oscillator or integrated oscillator.

The output of an oscillator circuit according to any aspect of the invention is preferably sent to a timer, e.g. a timer located on the same integrated circuit as the oscillator. This timer may be used to control the power state of parts of the circuit, such as a microprocessor, microcontroller, radio transmitter components, radio receiver components, etc.

While oscillators according to the invention have been described as optionally comprising a calibration controller, it will be appreciated that the controller need not necessary be adjacent other parts of the oscillator circuit (such as the charge-storing means), on the integrated circuit, but may be separated therefrom. The same is true of other components of the oscillator, such as the switching means. Some functions of the oscillator may be carried out in whole or part by a microprocessor or microcontroller on the integrated circuit.

Optional features of any of the aspects of the invention may be optional features of any of the other aspects, wherever appropriate. Some or all of the aspects may be combined in a single method or apparatus.

Certain preferred embodiments of the invention will now be described, by way of example only, with reference to the accompanying drawings, in which.

Figure 1:
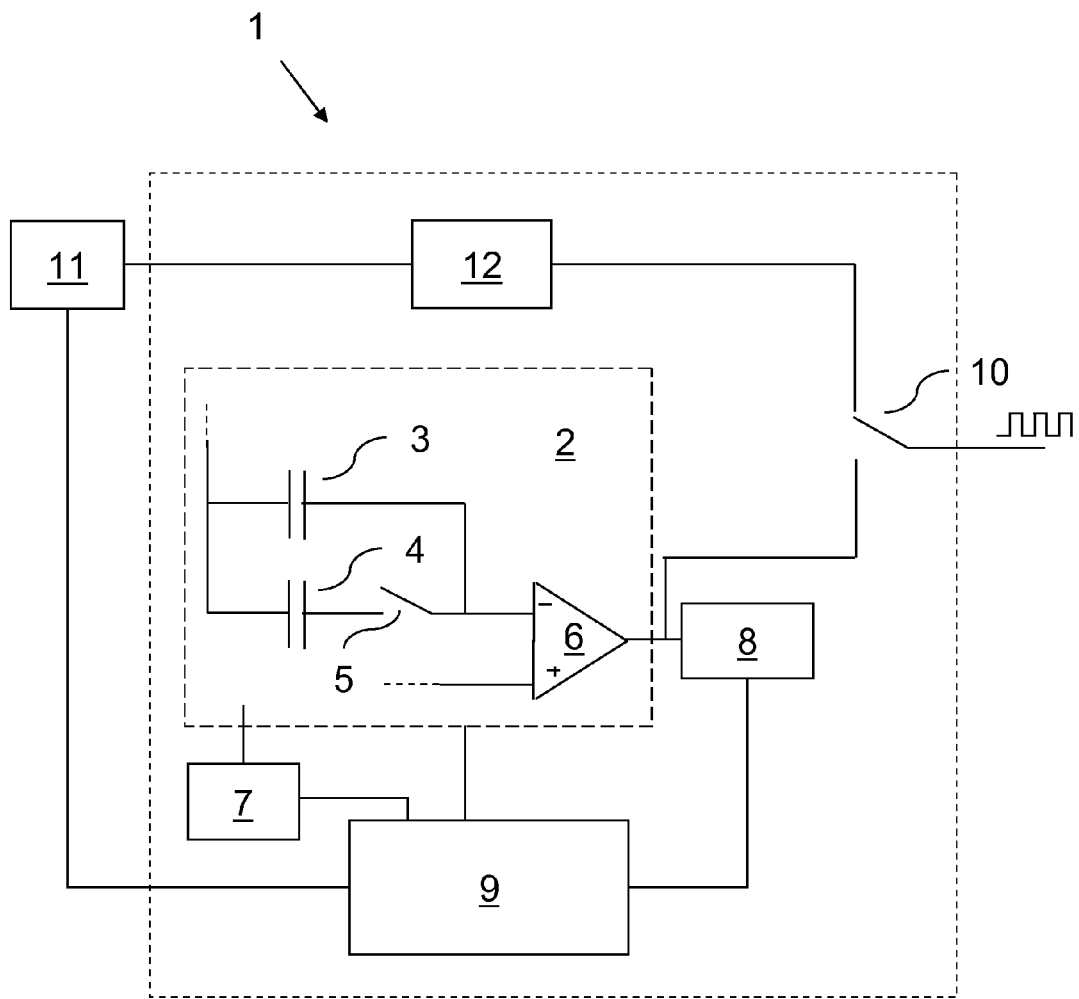
FIG. 1 is a diagrammatic overview of key components an oscillator circuit embodying the invention.

FIG. 1 figuratively shows key parts of a 32 KiHz (1 kibiHertz=1024 Hertz) oscillator circuit 1 embodying the invention.

The oscillator circuit 1 comprises an RC oscillator 2 which, among other well-known components (not shown), has a first capacitor 3 and a second capacitor 4. A switch 5 (e.g. a transistor) connects the second capacitor 4 into the circuit, in parallel to the first capacitor 3, when it is closed. When the switch 5 is open, only the first capacitor 3 is used in the RC oscillator circuit. A comparator 6 uses a supplied reference voltage to provide feedback to the RC oscillator and to generate an oscillating output. The RC oscillator receives a controlled current from a programmable current source 7.

The output from the RC oscillator 2 passes through a calibration counter 8, which is connected to control logic 9. The output also passes via a switch 10 (e.g. a multiplexer) before leaving the oscillator. This switch 10 can select between the RC oscillator output, and the output of a frequency-down-converter 12, which is fed by an off-chip 16 MHz crystal oscillator 11 ("16 MHz XOSC"). The frequency-down-converter 12 generates a 32 KiHz signal from the crystal oscillator 11.

The control logic 9 receives an input from the 16 MHz crystal oscillator 11, from which it can derive a 4 MHz signal, which it uses to calibrate the RC oscillator 2. The control logic 9 is able to control the capacitor switch 5, the output switch 10, and the programmable current source 7.

When correctly calibrated, the oscillator circuit 1 outputs a signal from the RC oscillator 2 which is effectively at 32 KiHz. The input current is set such that, when the second capacitor 4 is switched into the circuit, the RC oscillator output frequency is a little below 32 KiHz, and when the second capacitor 4 is switched out of the circuit, the RC oscillator output frequency is a little above 32 KiHz. The control logic 9 controls the capacitor switch 5 so as to switch the second capacitor 4 in and out of the circuit from cycle to cycle according to a pattern that gives an output from the oscillator circuit 1 averaging 32 KiHz over a number of cycles, with negligible frequency jitter.

In order to achieve this calibrated state, the control logic 9 can apply a coarse calibration operation and a fine calibration operation.

The control logic 9 counts, using the calibration counter 8, the number of 4 MHz pulses derived from the crystal oscillator 11 that occur during 256 pulses of the RC oscillator operating at its higher frequency (i.e. with the second capacitor 4 switched out of the circuit). If the frequency of the RC oscillator is determined to be outside an intended frequency range, a coarse calibration is performed by adjusting the programmable current source 7 so as to increase or decrease the current supplied to the RC oscillator 2 in increments, until it is within the acceptable range.

When the coarse calibration is correct, a fine calibration operation can be performed. The control logic 9 counts the number of 4 MHz pulses derived from the crystal oscillator 11 that occur during 256 pulses of the RC oscillator operating at its higher frequency (i.e. with the second capacitor 4 switched out of the circuit) and again with the RC oscillator operating at its lower frequency (i.e. with the second capacitor 4 switched into the circuit). The control logic 9 uses these two count values to determine the proportion of high- to low-frequency cycles that are needed over a calibration period (e.g. of 1024 cycles) in order to achieve the desired 32 KiHz output. This calculation is explained in more detail below.

The control logic 9 uses the latest proportion value to control the capacitor switch 5 to give the desired cycle ratio. A sigma-delta circuit is used to distribute the low-frequency cycles uniformly amongst the high-frequency cycles, as explained in more detail below.

During the calibration operation, it is not possible to provide an accurate output from the oscillator circuit 1 using the RC oscillator 2 (since it must be run for a set number of cycles at each frequency). Therefore, the control logic 9 switches the output switch 10 to provide a 32 KiHz output signal from the oscillator 1 that is derived from the external crystal 11. The crystal-derived output may also be used when the control logic 9 determines that a calibration operation is required, but is waiting to perform it.

The implementation is described in more detail below.

Figure 2:
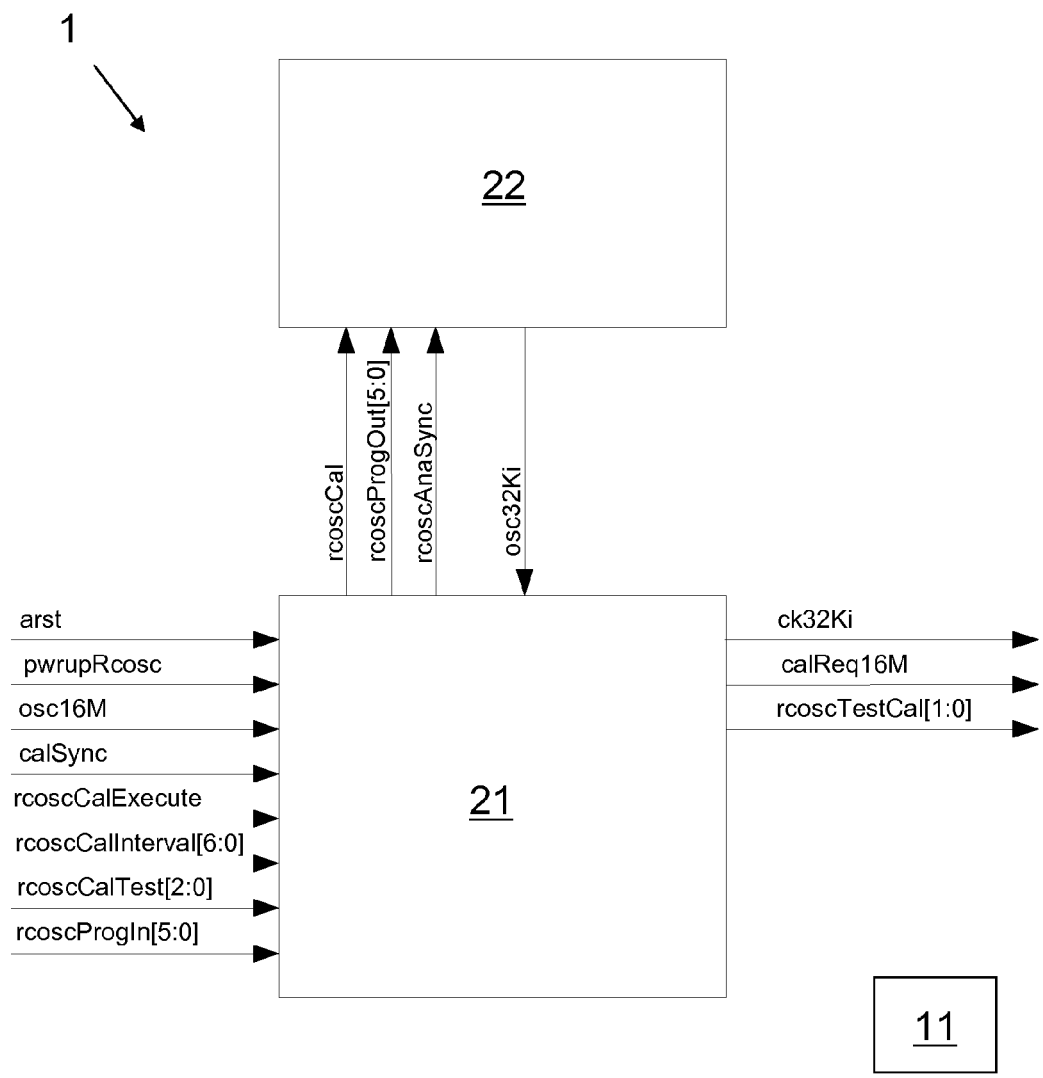
FIG. 2 is a diagrammatic overview showing signals to and from the digital and analogue parts of the circuit.

FIG. 2 shows how the oscillator circuit 1 is divided into a digital part 21 and an analogue part 22. Some of the important signals between the parts 21, 22 are shown.

The analogue part 22 contains an RC oscillator circuit which is calibrated by the digital part 21. Coarse and fine calibration operations can be performed.

The digital part 21 of the oscillator can receive inputs from other parts of an integrated circuit, such as a microcontroller (not shown), and the external 16 MHz crystal oscillator 11. In particular, it is configured to receive the following input signals:

| SIGNAL NAME | DESCRIPTION |
| --- | --- |
| arst | Reset pin. Active high. |
| pwrupRcosc | Enable digital circuit if high. |
| osc16M | Clock signal from 16 MHz crystal oscillator |
| calSync | Calibration synchronization. Goes high at least 15 ms before 16 MHz crystal oscillator is started up e.g. for use by a microcontroller. Goes low after control of the 16 MHz crystal oscillator has passed to a wake-up timer. |
| rcoscCalExecute | Initiates a calibration cycle. If rcoscCalInterval = 0x00: Calibrate when high. If rcoscCalInterval <> 0x00: Auto calibration as defined by rcoscCalInterval when high. No calibration when low. |
| rcoscCalInterval[6:0] | Time between calibration of oscillator in multiples of 0.25 seconds (range 0.25 to 31.75 sec). If set to 0x00 calibration will start at positive edge of rcoscCalExecute and positive edge of calSync. |

The digital part 21 can output the following signals:

| SIGNAL NAME | DESCRIPTION |
| --- | --- |
| ck32Ki | 32 KiHz (32,768 Hz) clock output. |
| calReq16M | Request to turn on 16 MHz crystal oscillator for use in calibration. If calSync is high, keep calReq16M high until calSync goes low. |

The analogue part 22 outputs a 32 KiHz clock signal as follows:

| SIGNAL NAME | DESCRIPTION |
| --- | --- |
| osc32Ki | 32 KiHz clock signal |

The analogue part 22 is controlled by the digital part 21, via the following signal inputs:

| SIGNAL NAME | DESCRIPTION |
| --- | --- |
| rcoscCal | When high the period of the 32 KiHz oscillator output will increase by 1/32. Changes value on positive edge of ck32Ki. |
| rcoscProgOut[5:0] | Process tuning of current source in analogue part of oscillator (coarse calibration). |
| rcoscAnaSync | Reset signal for analogue part. Used to start oscillator in phase when the RC oscillator takes over from the crystal-oscillator-derived 32 KiHz. |

Figure 3:
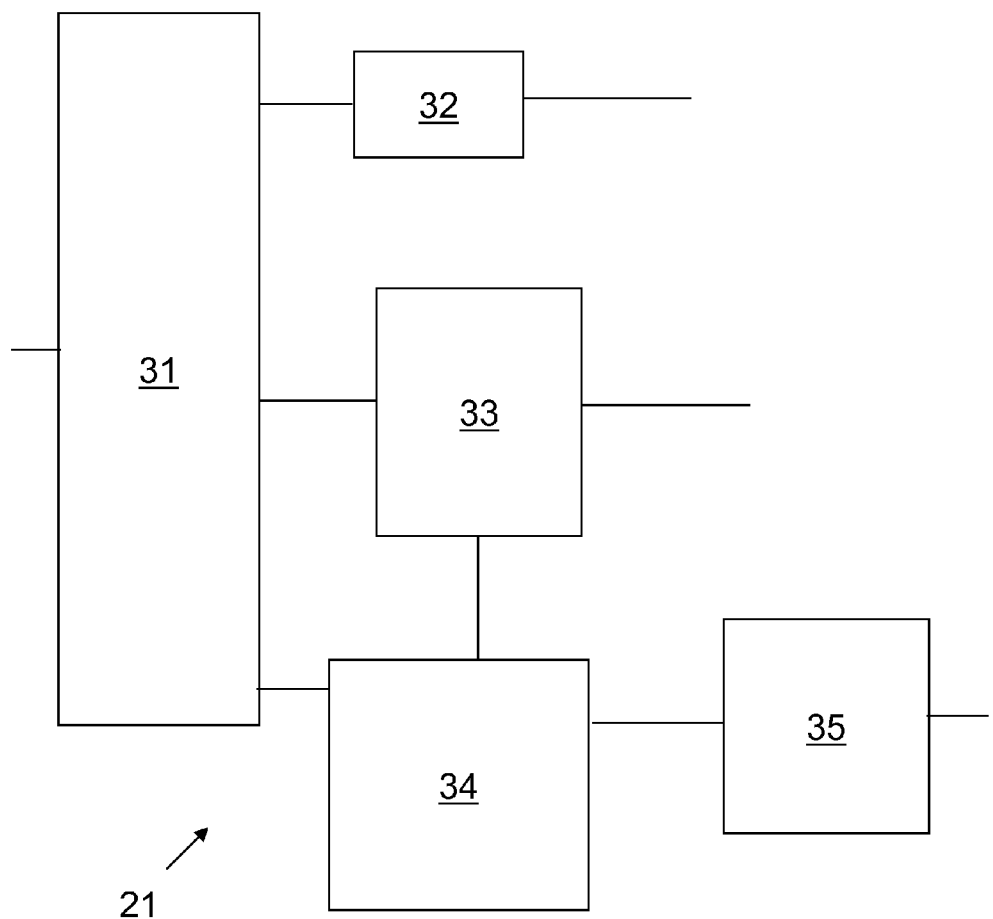
FIG. 3 is a diagrammatic representation of digital components of the circuit.

FIG. 3 gives an overview of the architecture of the digital part 21.

At a high level, the digital part 21 comprises: a calibration interval timer 31; a control circuit 32 for the analogue RC-oscillator; a calibration engine 33; a combined clock de-bouncer and divide-by-4 circuit 34; and a down-converting module 35 to generate a 32 KiHz clock from a 16 MHz source.

The digital part 21 is responsible for: performing coarse calibrations of the oscillator; performing fine calibrations of the oscillator; generating an accurate 32 KiHz clock from the oscillator; and generating an accurate 32 KiHz clock from the external 16 MHz crystal oscillator 11.

The calibration interval timer 31 is the main controller of the digital part 21. It is always operating as long as pwrupRcosc is high. It serves several purposes:

on power-up it ensures the other modules in the system (including the analogue part 22 and the off-chip 16 MHz crystal oscillator 11) are started in the correct sequence;

it performs seamless switching between the RC-oscillator and the 16 MHz crystal-oscillator-derived output;

it decides when a calibration is due, and consequently starts up the 16 MHz crystal oscillator 11, the calibration engine 33, etc.; and when pwrupRcosc goes low it performs safe shutdown of the other modules in the system in the right sequence.

The control circuit 32 for the analogue part 22 has control over the analogue RC-oscillator during normal operation (i.e. in the interval between two calibrations).

The control circuit 32 is fully synchronous design, always operating on the RC-oscillator clock.

For a coarse calibration, the digital part 21 uses the 6-bit signal rcoscProgOut to control the analogue part 22. After reset or power-up this value is set to a default value. The calibration engine 33 counts pulses from a 4 MHz clock derived from the system clock during 256 pulses of the RC oscillator running at its higher frequency. The result of this measurement is used to increase or decrease the oscillator current via the programmable current source 7. This is repeated until the frequency of the oscillator is within 0 to 2.5% above the intended frequency.

In each coarse calibration cycle, the value can be stepped one value up or down. After a change up or down, the calibration operation is restarted after a delay of eight 32 KiHz cycles (to allow the analogue part 22 to settle) and the output measured again. Once the coarse calibration is correct, the RC oscillator will be running within 100.0 to 102.5% of 32 KiHz if rcoscCal is low, and within 97.5 to 100.0% if rcoscCal is high.

Fine calibration makes use of the capability in the analogue part 22 to selectively increase the oscillator period by 1/32. The fine calibration algorithm measures the oscillator's nominal period (T1) and the longer period (T2), and calculates from these how many periods N the oscillators should run at T2 during a 1024 period sequence so that the average output frequency of the oscillator is 32 KiHz (32.768 kHz).

In a fine calibration, the RC oscillator output frequency is measured as in the coarse calibration, but at both the higher frequency f1 and the lower frequency f2, in order to obtain a count X1 of 4 MHz pulses at the higher frequency, and a count X2 of 4 MHz pulses when the RC oscillator is running at the lower frequency, during a period of 256 RC oscillator cycles.

The value N is calculated as $$N(X1,X2)=1024*(31250-X1)/(X2-X1).$$

(noting that 31250=256*4,000,000/32,768).

For the coarse calibration to be valid, the X1 value must not exceed 31250 (if it does, this is flagged as an error, and the coarse calibration must be adjusted). X1 should not be less than 2.5% below this value (since this is the step size of the coarse calibration adjustment). However, since this is an analogue value, it is wise to allow for double this range in practice. Thus, for a valid fine calibration, X1 is permitted to lie in the range [29709, 31250].

The maximum functional X2 value is given by an estimate of how much the analogue 33/32 ratio may deviate from ideal. To be on the safe side this is doubled (i.e. 34/32), which gives a maximum permitted value for X2 of 31250*34/32=33203. Thus X2 is permitted to lie in the range [31250, 33203].

To ensure that there is no chance of overflow, 16-bit counters are used for X1 and X2.

The calculation comprises two subtractions and one division (since the multiplication by 1024 is simply a 10-bit left-shift). The division is the costly part and is done serially. Care is taken to avoid truncation in the calculation, which might otherwise lead to additional frequency offset of the clock. A dedicated part of the calibration engine 33 carries out the calculation. The output value N is passed to the control circuit 32 for the RC oscillator.

The RC oscillator is controlled so that the average frequency over a 1024 period span will be within +/−100 ppm of 32 KiHz. The RC oscillator will run at frequency f1 (1/T1) for 1024-minus-N periods and at frequency f2 (1/T2) for N periods. When the output rcoscCal is high, the frequency of the RC-oscillator is reduced by approximately 1/33.

To minimize timing variations, the cycles at f1 and f2 are interleaved by the calibration engine 33. A 10-bit input signal specifies for how many cycles N in a 1024 cycle interval rcoscCal should be high. To obtain uniform spreading of high frequency (rcoscCal=0) and low frequency (rcoscCal=1) cycles, a first-order sigma-delta circuit is used.

Figure 4:
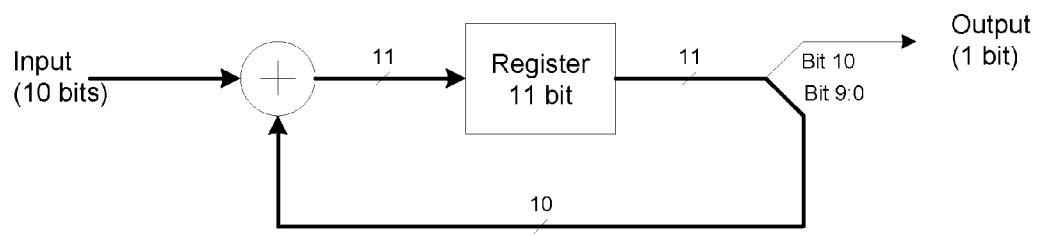
FIG. 4 is a diagram of sigma-delta circuit, used to determine a switching pattern for the oscillator.

FIG. 4 shows the sigma-delta circuit in schematic form. It consists of a 10-bit adder leading to an 11-bit register. The input value N enters the adder, where it is added to feedback from the register output. This 10-bit feedback value comprises all but the most-significant bit of output from the register. Mathematically, the circuit calculates incremental multiples of the input value, modulo 1024. The most significant bit of the register's output determines rcoscCal, which will be 1 every time a multiple of the input value is reduced mod 1024.

The resolution of the fine calibration is directly dependent on the capacitor ratio (C2/C1), and the number of pulses $N_T$ in the calibration interval (i.e. 1024 in this example). The smallest step achievable is that one 32 KiHz period is lengthened by 1/32 period over the entire calibration interval. This implies a resolution in frequency of $$(1/N_T)*(C2-C1)/C1=(1/1024)*(1/32)=+/-15 \text{ ppm}.$$

The calibration engine 33 is directly controlled from the calibration interval timer 31. To start up calibration it receives two signals: startCalib and enableCalib. The startCalib is a short pulse (one RC oscillator period) used to initiate the calibration. The enableCalib signal is held high during the entire calibration. The enableCalib signal can thus be used to interrupt calibration (normally when the calibration is finished and valid but also in the case that pwrupRcosc goes low) and perform a safe shutdown.

The calibration engine 33 is a fully synchronous design, except for the osc32Ki signal from the analog RC-oscillator and startCalib and enableCalib signals from the calibration interval timer 31, which are synchronised before use. To improve accuracy in calibration, the synchronisation circuit is also used to detect a positive edge on rcoscIn before RC-oscillator pulse counting is started.

The combined clock de-bouncer and divide-by-4 circuit 34 ensures that the crystal-oscillator clock has reached stable amplitude and frequency before it is used in the other modules in the design. To ensure this, the de-bouncer counts 16 MHz pulses for 500 microseconds before the clock is let through. The divide-by-4 part of the circuit 34 generates a 4 MHz clock for use in the calibration engine 33. This can be implemented by clock gating (only every fourth pulse is let through), so that the output does not have 50% duty cycle.

The down-converting module 35 is used to generate 32 KiHz from the 16 MHz input clock. Because 16 MHz is not an integer multiple of 32 KiHz, it uses a sigma-delta method that effectively gives a clock with average frequency of 32 KiHz, but with some cycle-to-cycle jitter.

The 32 KiHz signal generated from the external 16 MHz crystal 11 is used instead of the RC oscillator output when the RC oscillator needs recalibrating and during a calibration operation.

Figure 5:
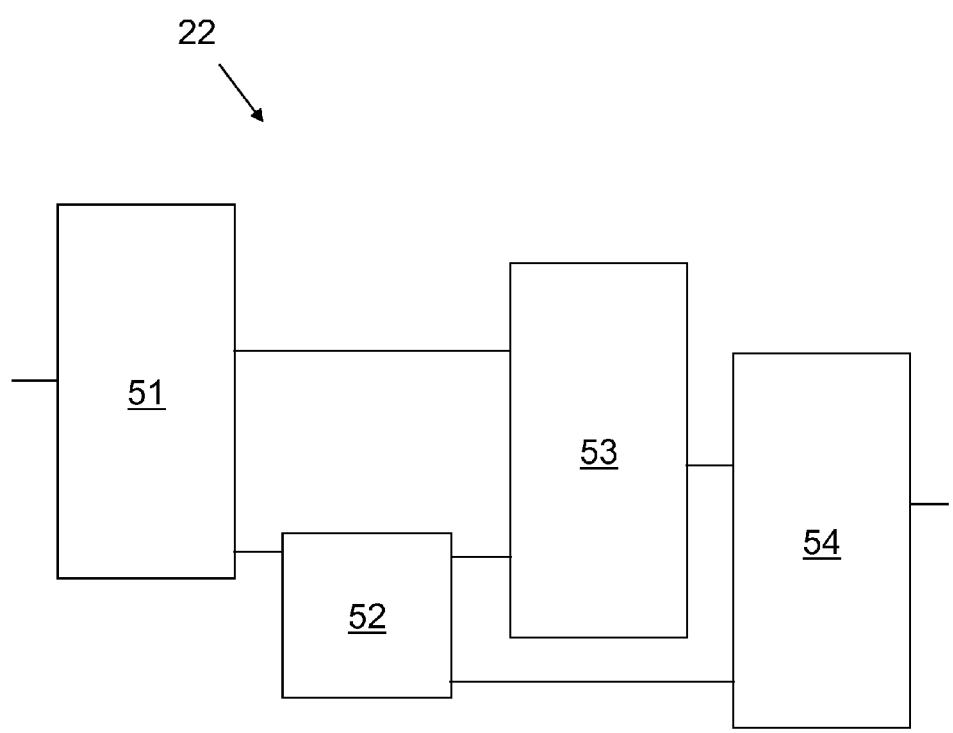
FIG. 5 is a diagrammatic representation of analogue components of the circuit.

FIG. 5 shows major components of the analogue part 22 of the oscillator circuit 1. These comprise a programmable current and voltage generator 51, a charge pump 52, a comparator 53, and a digital control module 54.

The digital control module 54 contains an SR latch, etc. and outputs the final clock signal. The charge pump 52 receives an accurate reference current from the current and voltage generator 51, while an accurate reference voltage is provided to the comparator 53. A digital input to the current generator 51 can be used to adjust the current in steps of at most 2.5% of the nominal frequency, for the purposes of coarse calibration.

Figure 6:
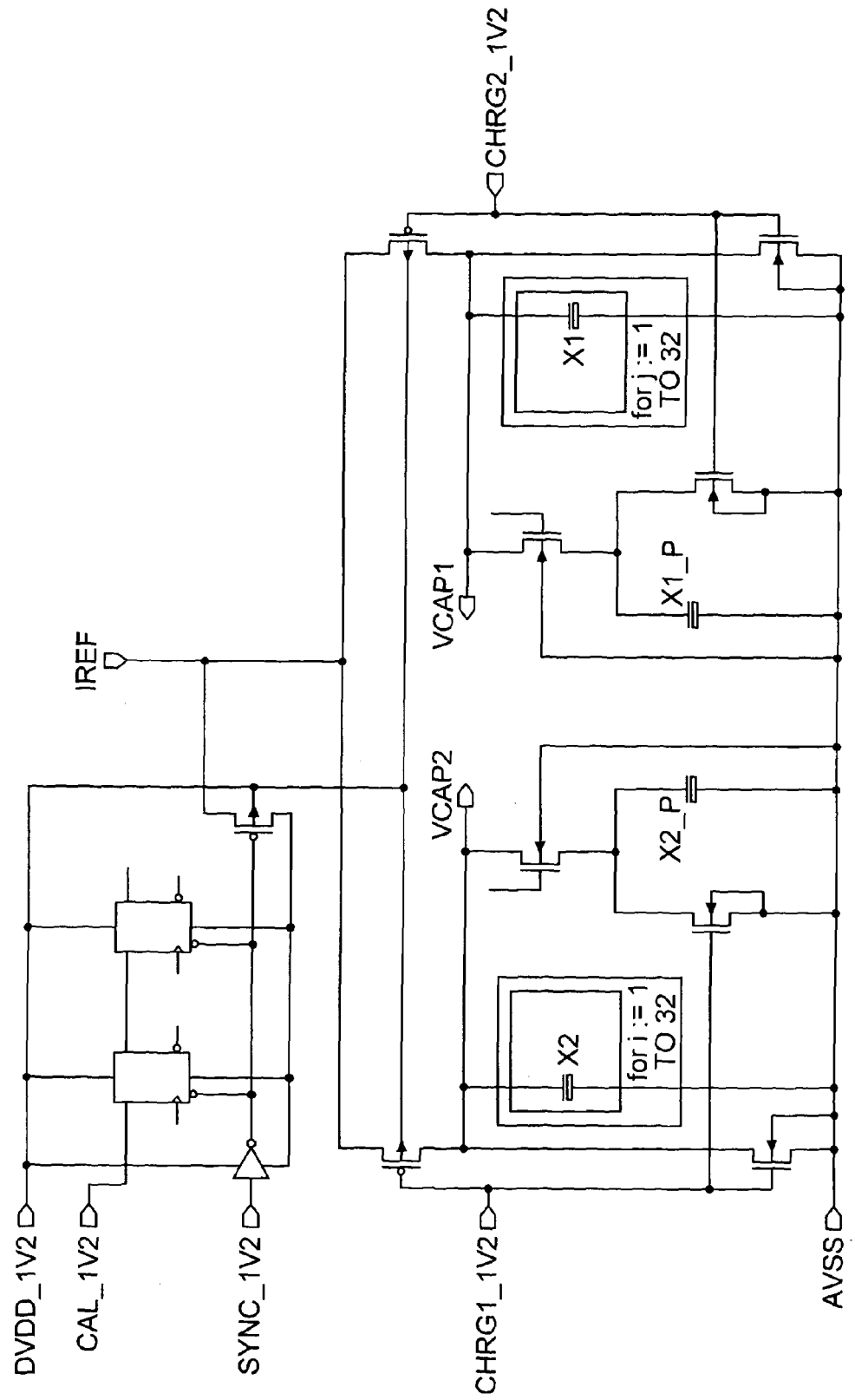
FIG. 6 is a circuit diagram of a charge pump within the analogue circuit.

FIG. 6 shows the charge pump 52 circuit in detail. It is formed in two halves, each operating in a respective half period of the clock. This is controlled by the CHRG1__1V2 and CHRG2__1V2 inputs. The CAL__1V2 input selects between the lower and higher frequencies; i.e. between $32*C_{Unit}$ (CAL=0) and $33*C_{Unit}$ (CAL=1), by switching additional capacitors X2_P and X1_P into or out of the circuit. Two D-type flip-flops ensures that switching of capacitors by means of the CAL__1V2 input is performed synchronously with the oscillator signal. There is also a SYNC__1V2 input which will stop the oscillation when SYNC__1V2 is high, and restart the oscillator immediately with correct phase when it goes low.

Figure 7:
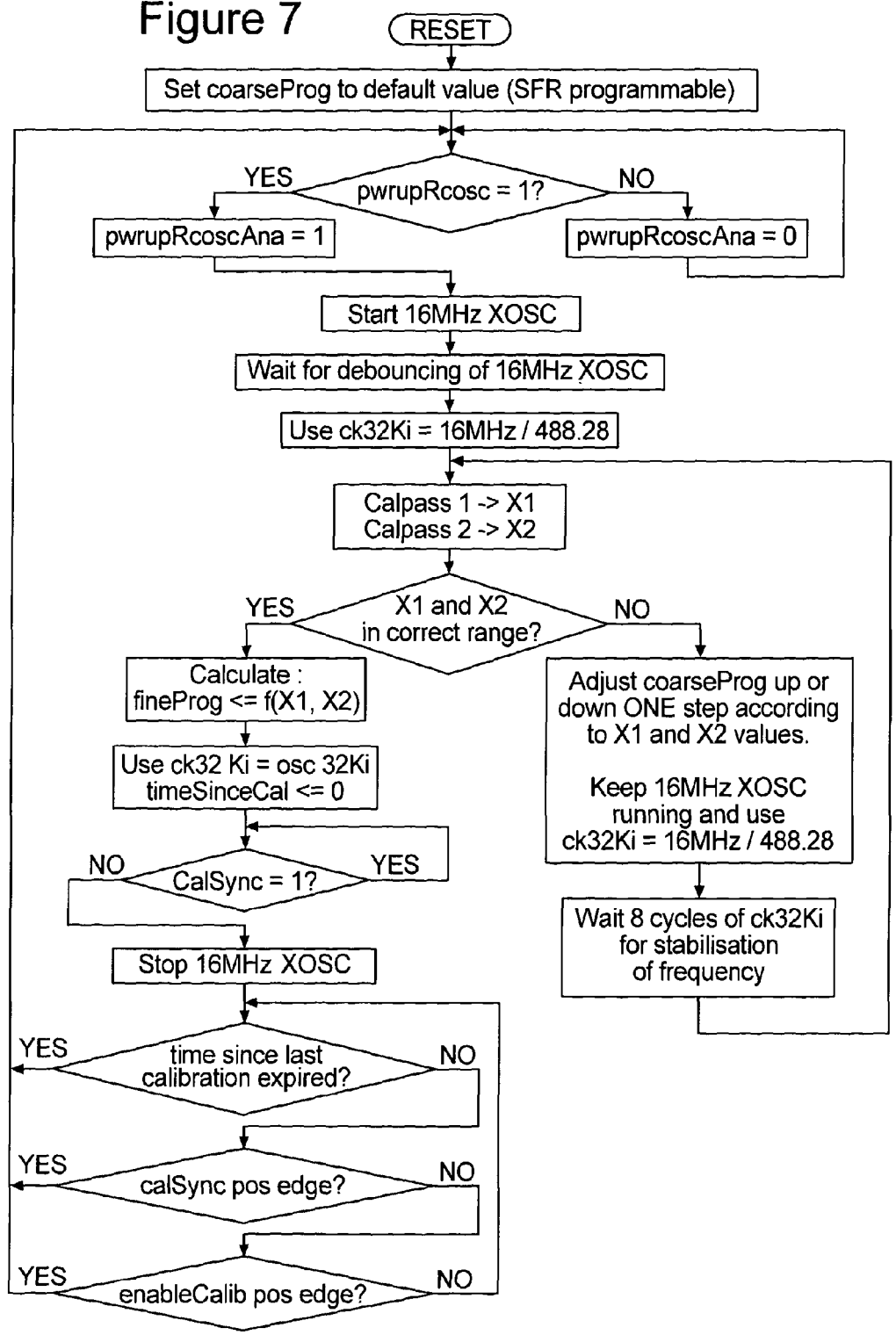
FIG. 7 is a flow chart for the calibration function.

FIG. 7 shows, by way of a flow chart, some of the main steps in the calibration process for the oscillator circuit 1. Calibration is performed after a reset, or when a defined period of time has elapsed since the last calibration, or when the 16 MHz crystal oscillator 11 is started up (calSync high). If X1 and X2 are determined to be outside their correct ranges, a coarse calibration is performed, until they are within their ranges. A fine calibration is then performed to determine a value fineProg that controls the ratio of high- to low-frequency oscillations.

During the calibration operations, the output from the oscillator is derived from the external crystal oscillator 11.

Thus, an accurate RC-based oscillator circuit has been described. Although the circuit has been described with reference to a 32 KiHz output frequency, it will be understood that any desired output frequency is possible.

The invention claimed is:

1. An integrated oscillator circuit comprising:
    an oscillator configured to be switched between a first frequency and a second frequency;
    switching circuitry configured to receive an input representative of a target frequency and to switch the oscillator between the first and second frequencies at intervals determined by the input so as to cause the average output frequency of the oscillator to approximate the target frequency; and
    circuitry for calibrating the oscillator against a reference clock, wherein the integrated oscillator circuit is configured to output a clock signal derived from a crystal oscillator while said oscillator is being calibrated, and to output a clock signal derived from said oscillator when the integrated oscillator circuit is not being calibrated.

2. The integrated oscillator circuit of claim 1 wherein a higher one of the first and second frequencies is less than double a lower one of the two frequencies.

3. The integrated oscillator circuit of claim 2 wherein the higher of the first and second frequencies is less than 10 percent higher than the lower of the two frequencies.

4. The integrated oscillator circuit of claim 1 wherein one of the first and second frequencies is incrementally adjustable, and wherein the difference between the first and second frequencies is wider than a smallest increment by which said frequency can be adjusted.

5. The integrated oscillator circuit of claim 1 wherein the switching circuitry is configured to receive an input comprising or encoding a value indicating a switching ratio between the first and second frequencies.

6. The integrated oscillator circuit of claim 1 comprising a calibration controller configured to provide the input representative of the target frequency to the switching circuitry and further configured to calibrate the oscillator at intervals in order to provide an updated input to the switching circuitry.

7. The integrated oscillator circuit of claim 6 wherein the calibration controller is configured to count oscillator output cycles over a reference time period for each of the first and second frequencies, and to derive an input to the switching circuitry from these counts.

8. The integrated oscillator circuit of claim 1 comprising charge-storing circuitry whose capacitance can be varied between a first value and a second value; and a current source connected to the charge-storing circuitry, to form an oscillator configured to oscillate at the first frequency when said capacitance is equal to the first value, and at the second frequency when the capacitance is equal to the second value, wherein the switching circuitry is configured to switch the charge-storing circuitry between the first and second capacitance values at intervals determined by the input.

9. The integrated oscillator circuit of claim 8 wherein the charge-storing circuitry comprises a first capacitor that is permanently connected into the oscillator circuit, and a second capacitor that is selectively connectable into the circuit.

10. The integrated oscillator circuit of claim 8 wherein the charge-storing circuitry comprises first and second capacitors having respective first and second capacitances, and a switch arranged to connect one or other of the first capacitor and the second capacitor into the oscillator circuit at a time.

11. The integrated oscillator circuit of claim 1 wherein the switching circuitry is configured to distribute first-frequency cycles among second-frequency cycles according to a predetermined pattern or dispersion characteristic.

12. The integrated oscillator circuit of claim 1 wherein the switching circuitry comprises a sigma-delta modulator, arranged to distribute frequency cycles at the first frequency as uniformly as possible among frequency cycles at the second frequency, over a finite time period.

13. The integrated oscillator circuit of claim 1 comprising a programmable current source, wherein the oscillator is arranged so that the value of one or both of the first and second frequencies depends on the level of a variable current within the oscillator circuit.

14. The integrated oscillator circuit of claim 1 further comprising a microprocessor.

15. The integrated circuit of claim 14, configured to calibrate the oscillator in response to the microprocessor waking up.

16. The integrated circuit of claim 14, comprising circuitry forming all or part of a radio transmitter or receiver configured to transmit or receive radio packets according to a schedule implemented using the integrated oscillator as a clock source.

17. The integrated circuit of claim 14, configured to use said crystal oscillator as a system clock for the microprocessor.

18. The integrated oscillator circuit of claim 1 wherein the reference clock is the crystal oscillator.

19. The integrated oscillator circuit of claim 1 wherein said output derived from a crystal oscillator is substantially the same frequency as the output derived from said oscillator.

20. The integrated oscillator circuit of claim 1, configured to change from one of said outputs to the other of said outputs within one clock cycle.

21. A method of operating an integrated oscillator circuit, wherein the circuit comprises an oscillator configured to be switched between a first frequency and a second frequency, the method comprising:
receiving an input representative of a target frequency;
switching the oscillator between the first and second frequencies at intervals determined by the target frequency so as to cause the average output frequency of the oscillator to approximate the target frequency;
calibrating the oscillator against a reference clock;
outputting a clock signal derived from a crystal oscillator during said calibration; and
outputting a clock signal derived from said oscillator while the circuit is not being calibrated.

22. The method of claim 21, wherein a higher one of the first and second frequencies is less than double a lower one of the two frequencies.

23. The method of claim 21 wherein the higher of the first and second frequencies is less than 10 percent higher than the lower of the two frequencies.

24. The method of claim 21, wherein the input comprises or encodes a value indicating a switching ratio between the first and second frequencies.

25. The method of claim 21, further comprising calibrating the oscillator at intervals to generate an updated input representative of the target frequency.

26. The method of claim 21, comprising counting oscillator output cycles over a reference time period for each of the first and second frequencies, and deriving an input representative of the target frequency from these counts.

27. The method of claim 21, comprising switching the oscillator so as to distribute first-frequency cycles among second-frequency cycles according to a predetermined pattern or dispersion characteristic.

28. The method of claim 21, comprising coarsely calibrating the oscillator by adjusting the values of at least one the first and second frequencies so that they span the target frequency.

29. The method of claim 28, wherein said adjusting of the values comprises adjusting a current source.

30. The method of claim 28, comprising performing said coarse calibration when the integrated-circuit oscillator is powered up.

31. The method of claim 21, comprising calibrating the oscillator against the crystal oscillator.

32. The method of claim 21, wherein the output derived from the crystal oscillator is substantially the same frequency as the output derived from the oscillator.

33. The method of claim 21, comprising changing from one of said outputs to the other within one clock cycle.

* * * * *